(12) United States Patent
Duron

(10) Patent No.: US 7,339,481 B2
(45) Date of Patent: Mar. 4, 2008

(54) RFID TAG WITH TUNABLE ANTENNA AND ASSOCIATED READER

(75) Inventor: Mark William Duron, East Patchogue, NY (US)

(73) Assignee: Symbol Technologies, Inc., Holtsville, NY (US)

( * ) Notice: Subject to any disclaimer, the term of this patent is extended or adjusted under 35 U.S.C. 154(b) by 372 days.

(21) Appl. No.: 11/001,169

(22) Filed: Nov. 30, 2004

(65) Prior Publication Data

US 2005/0104790 A1    May 19, 2005

(51) Int. Cl.
*G08B 13/14* (2006.01)
(52) U.S. Cl. ............... 340/572.7; 235/375; 343/700 R
(58) Field of Classification Search ............... 340/572.7
See application file for complete search history.

(56) References Cited

U.S. PATENT DOCUMENTS

| | | | | |
|---|---|---|---|---|
| 6,806,812 | B1* | 10/2004 | Cathey | 340/572.7 |
| 7,123,129 | B1* | 10/2006 | Schrott et al. | 340/10.1 |
| 2003/0214419 | A1* | 11/2003 | Reindl | 340/870.01 |
| 2006/0286938 | A1* | 12/2006 | Murdoch | 455/73 |

* cited by examiner

*Primary Examiner*—George Bugg
(74) *Attorney, Agent, or Firm*—Ingrassia Fisher & Lorenz, P.C.

(57) ABSTRACT

In one exemplary embodiment of the present invention a RFID tag for use in environments that cause antenna detuning is disclosed. The RFID tag comprises an antenna configured to receive radio frequency signals and an adjustable impedance adder coupled to the antenna. The impedance adder is configured to provide a needed amount of impedance to the antenna to compensate for detuning.

21 Claims, 5 Drawing Sheets

RFID TAG WITH TUNABLE ANTENNA AND ASSOCIATED READER

TECHNICAL FIELD

This invention relates to the field of radio frequency identification and, more specifically to a RFID system with selectable backscatter parameters.

BACKGROUND

In today's highly competitive marketplace, the ability to manage and track inventory is vitally important. A major cost to consumer retail stores and other businesses that handle a large inventory is the cost of tracking individual items of the inventory as those items move throughout the supply chain.

Traditionally, barcodes and barcode scanners have been used to track inventory. Barcode scanning systems work by labeling items with a barcode that encodes a product identification number. When needed, the barcode is read using a barcode reader. While this system is useful for many applications, barcodes have several drawbacks. First, barcodes are limited in the amount of information that can be encoded. Also, once a barcode is printed, it is difficult to change the barcode and thus it is difficult to change the encoded information. Additionally, a barcode must typically be in the line of sight of the barcode reader to be read.

To alleviate some of the drawbacks of barcode systems, various Radio Frequency Identification (RFID) systems have been proposed. In a typical asset-tracking embodiment, a RFID system comprises at least one RFID reader and at least one RFID tag. RFID tags are placed upon the asset to be tracked. RFID tags typically fall into one of two types; active RFID tags, which include an on-board power source (such as a battery) or passive RFID tags, which are powered by a radio frequency carrier wave sent from the RFID reader. Active RFID tags typically can be read by a RFID reader at a longer range than passive RFID tags, which typically must be near the tag reader in order to receive the carrier wave from the RFID reader to power the RFID tag.

Passive RFID tags typically store data in a non-volatile memory. To retrieve the stored data, a RFID reader emits a time varying radio frequency (RF) carrier wave, which powers the passive RFID tag by the generation of an AC voltage across the antenna of the passive tag. The AC voltage is typically rectified to a DC voltage. The DC voltage builds until a minimum operating DC voltage is reached, enabling the RFID tag. Once enabled, the RFID tag can send data stored in the RFID tag memory to the RFID reader. This is typically done by modulated backscattering of the carrier wave received from the RFID reader. The RFID tag backscatters by causing changes in the amplitude and/or phase of the RFID reader's carrier frequency. The RFID tag performs the modulation of the RF carrier wave by altering the load impedance of the RFID tag's antenna.

The antenna on a typical RFID tag is designed to receive a RF carrier wave at a particular frequency. However, various environmental factors can detune the RFID tag's antenna, resulting in a shifting in the frequency to which the RFID tag antenna is sensitive. For example, a RFID tag attached to a liquid filled container can experience antenna detuning due to a parasitic capacitance provided by the container. The amount of this detuning can vary as the package is moved; if the package tilts, less liquid may be near the RFID tag, resulting in a smaller parasitic capacitance and therefore, a smaller amount of detuning.

Therefore, there is a need to provide RFID tags that have a tunable antenna and an associated reader.

BRIEF SUMMARY

In one exemplary embodiment of the present invention a RFID tag for use in environments that cause antenna detuning is disclosed. The RFID tag comprises an antenna configured to receive radio frequency signals and an adjustable impedance adder coupled to the antenna. The impedance adder is configured to provide a needed amount of impedance to the antenna to compensate for detuning. In one exemplary embodiment of the present invention, a code is sent to the RFID tag by a RFID reader. The code specifies the needed amount of impedance to compensate for detuning.

In another exemplary embodiment of the present invention a method for adjusting the tuning of a RFID antenna is disclosed. In a first step, signal is received the RFID antenna. The signal includes a setting indicative of an amount of impedance to provide to adjust the tuning of the RFID antenna. Next, an impedance source is adjusted to provide impedance in the amount of impedance indicated by the setting. Then the impedance from the impedance source is coupled to the RFID antenna. In another aspect of this exemplary embodiment one or more capacitors are coupled to the RFID antenna to provide the amount of impedance.

BRIEF DESCRIPTION OF THE DRAWINGS

The present invention will hereinafter be described in conjunction with the following drawing figures, wherein like numerals denote like elements, and.

DETAILED DESCRIPTION

The following detailed description is merely exemplary in nature and is not intended to limit the invention or the applications and uses of the invention. Furthermore, there is no intention to be bound by any expressed or implied theory presented in the preceding technical field, background, brief summary or the following detailed description. Moreover, while passive RFID tags are discussed below, this is for exemplary purposes only and the present invention can utilize passive, semi-passive or active RFID tags.

Figure 1:
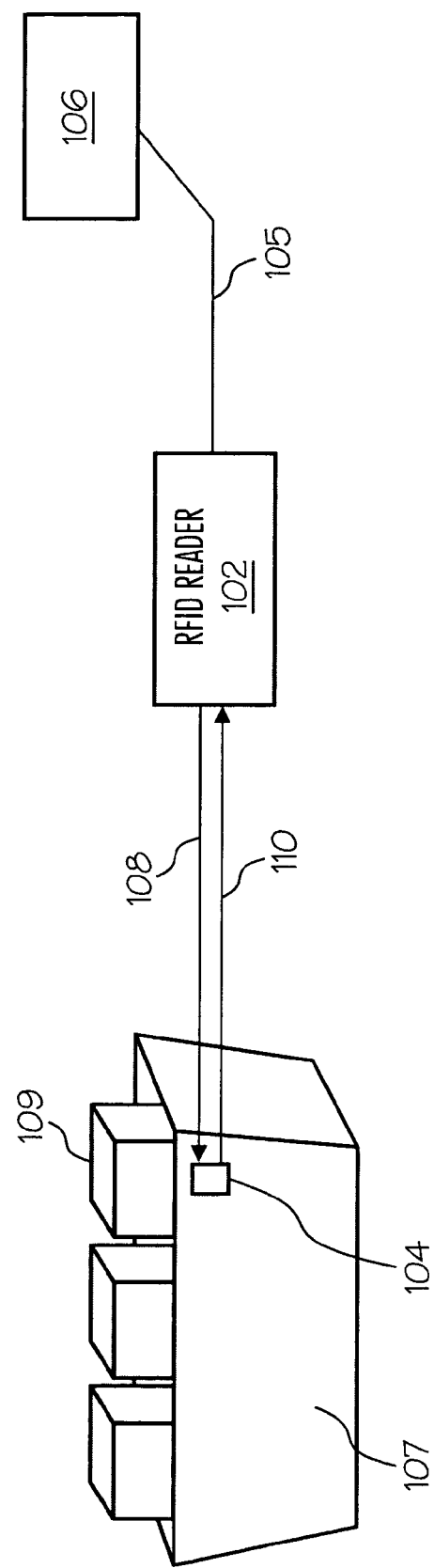
FIG. 1 is a block diagram of a RFID system in accordance with the teachings of the present invention.
Figure 2:
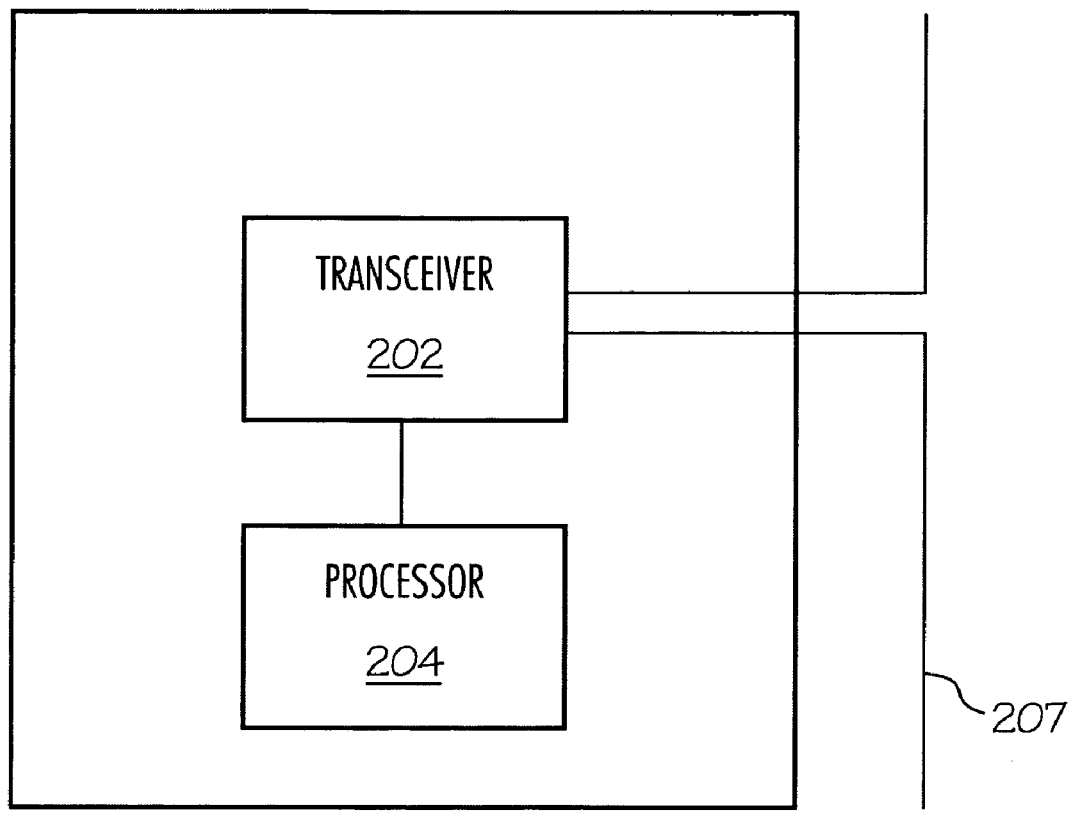
FIG. 2 is a block diagram of a RFID tag in accordance with an exemplary embodiment of the present invention.
Figure 3:
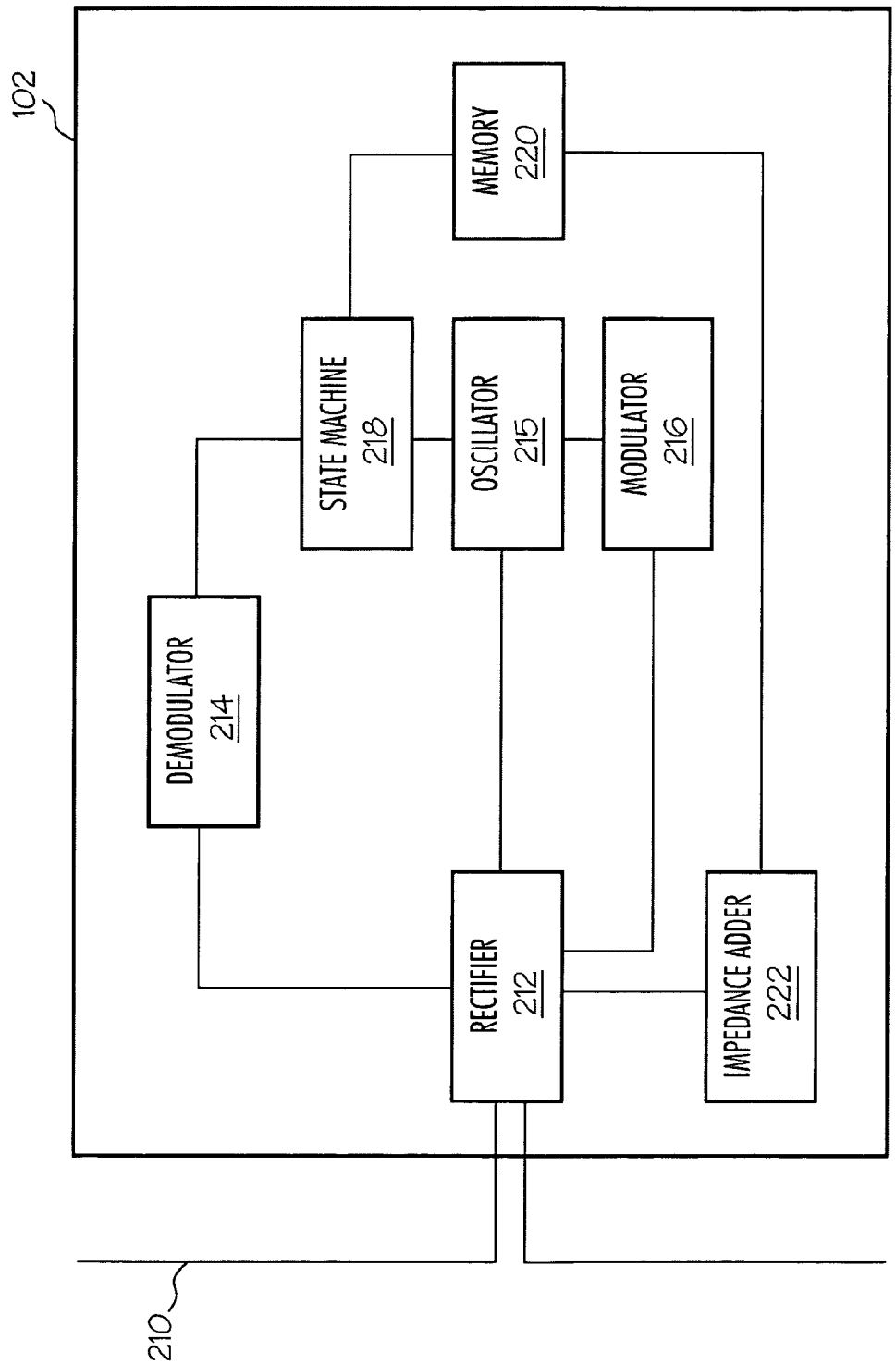
FIG. 3 is a block diagram of a RFID reader in accordance with an exemplary embodiment of the present invention.

FIGS. 1-3 illustrate a RFID system 100 in accordance with an exemplary embodiment of the present invention. RFID system 100, in one exemplary embodiment, comprises a RFID reader 102 in radio frequency communication with at least one RFID tag 104. RFID system 100 may also optionally include a computer system 106 coupled, wired or wirelessly, to the RFID reader 102. The RFID reader 102 can send interrogation signals 108 to the RFID tag 104 that responds by a backscattered modulation signal 110. In one exemplary embodiment of the present invention, RFID reader 102 can send a command to adjust the RFID tag's 104 antenna to compensate for detuning.

In the exemplary embodiment illustrated in FIG. 1, RFID tag 104 attaches to a bin 107 in which products 109 can be placed for travel down a conveyer system or similar system. The products 109 placed within the bin 107 can act to detune the RFID tag 104. For example, if the bin 107 contains a great deal of water based liquids, the liquids can absorb the radio frequency transmissions and act as a parasitic capacitance to the RFID tag 104. The result is the frequency received by the antenna is shifted, typically to a lower frequency, and the power transferred between the RFID tag 104 and the RFID reader 102 drops. This is known as antenna detuning. In the present invention, the RFID tag 104 includes an adjustable impedance component that can be coupled to the antenna to compensate for the antenna detuning. While FIG. 1 illustrates an exemplary detuning scenario, detuning can occur in many different ways such as when RFID tags 104 are placed on products 109 containing or near water, metal and the like.

Optional computer system 106 receives data from RFID reader 102 and can perform some processing of that data. In an environment where the RFID system 100 is a point of sale system, once the RFID reader 102 receives the requested product code from the RFID tag 104 affixed to the product 109, that information can be sent to computer system 106. Computer system 106 can perform a price lookup and generate an entry into a sales receipt. In an inventory control system, information gathered by the RFID reader 102 can be sent to the computer system 106 running inventory tracking software. Various useful computer systems and the software needed to run them are known in the art.

In one exemplary embodiment, RFID reader 102 comprises a transceiver 202 coupled to a processor 204. Transceiver 202 couples to a RFID reader antenna 207. RFID reader 102 can be a portable unit or a fixed unit.

In one exemplary embodiment, processor 204 can provide transceiver 202 with proper commands to transmit to RFID tag 104 to set the state of the RFID tag 104 or perform other functions. Processor 204 can execute software routines to calibrate the RFID tag 104, including calibrating the RFID tag 104 to compensate for detuning. Processor 204 can be any processor, such as those processors conventionally used in RFID readers 102 or other similar applications.

Transceiver 202 can transmit signals, including transmitting a carrier wave signal to RFID tag 104, and can receive signals, including the backscattered signals from the RFID tag 104. Transceiver 202 includes any necessary circuitry needed to send and receive data such as any needed modulation/demodulation circuitry and any encoding/decoding circuitry. Transceiver 202 can be any one of the numerous transceivers 202 suitable for use in a RFID reader.

In one exemplary embodiment of the present invention and with reference to FIG. 3, RFID tag 104 includes an antenna 210 coupled to a voltage rectifier 212, which is coupled to a demodulator 214 and a modulator 216. The demodulator 214 is coupled to a state machine 218, which is coupled to a memory 220. Modulator 216 couples to the state machine 218, the memory 220 and, optionally, an oscillator 215. RFID tag 104 further includes an impedance adder 222 coupled to antenna 210.

Antenna 210 receives signals from the RFID reader 102 and sends signals back to the RFID reader 102. In one exemplary embodiment, antenna 210 can receive a RF transmission, such as a carrier wave sent by the RFID reader 102, which induces an AC voltage at the antenna 210 which can be rectified to power the RFID tag 104. Typically, the antenna 210 is designed such that the RFID tag 104 has a fixed resonant frequency about a predetermined operating frequency based in a base amount of impedance in the RFID tag and absent the effects of any detuning. Antenna 210 can be any conventional antenna useable in a RFID tag such as a coil antenna, a dipole antenna and the like.

Voltage rectifier 212, converts induced AC voltage in the antenna 210 to a useable DC voltage. The DC voltage powers the operation of the RFID tag 104. As the antenna 210 is exposed to the carrier wave from the RFID reader 102, the induced AC voltage is converted to a DC voltage when rectified by voltage rectifier 212. The DC voltage will increase until a critical voltage is reached, enabling the RFID tag 104. In one exemplary embodiment, voltage rectifier 212 can be a bridge rectifier, although there are many different designs for rectifiers that can be used in the present invention. Voltage rectifier 212 can include a capacitor or other energy storage component to store energy for use by the RFID tag 104.

Demodulator 214 demodulates incoming modulated signals received from RFID reader 102. While the initial RF carrier wave from the RFID reader 102 activates and powers RFID tag 104, as discussed previously, modulated data can also be sent by the RFID reader 102, such as data used to set the state of the RFID tag 104.

State machine 218 can be any device capable of storing a current status and, upon input, operate to change the state or cause an action or input to occur. In one exemplary embodiment of the present invention, state machine 218 sets the state of the RFID tag 104 upon receipt of a proper request or command from the RFID reader 102. States of the RFID tag 104 may include a read state, a write state, a calibration state, a command state and the like. State machine 218 can be implemented in many different ways such as a microprocessor, logic device and the like. In the present invention, the state machine 218 can include states that correspond to different amounts of impedances that need to be used to compensate for detuning.

Memory 220 stores data, including, depending on the use of RFID tag 104, a product identification number, product description and the like. Memory 220 is preferably a non-volatile memory. Depending on the application, memory 220 can be a read-only memory or a read/write memory. Memory 220 can also store data regarding the impedance adjustment necessary to compensate for detuning. For example, memory 220 can store a sequence of numbers or code that corresponds to an impedance adjustment. Memory 220 can be one memory 220 or can be a combination of different memories.

Oscillator 215 provides a clocking signal to RFID tag 104. Oscillator 215 can be set to a certain frequency, which can be then be down divided into other frequencies using a frequency divider circuit. The frequency set by the oscillator 215 can be used to set the frequency of the modulation of the carrier wave received by the RFID tag 104. In one exemplary embodiment, RFID tag 104 does not use oscillator 215 and time signals can be extracted from the carrier wave of the RFID reader 102.

Modulator 216 modulates the RF carrier wave sent by the RFID reader 102 to send the data to RFID reader 102. Modulator 216 can employ a variety of modulation means such as frequency shift key (FSK), phase shift key (PSK) and amplitude shift key (ASK). In a typical exemplary embodiment, the carrier wave from the RFID reader 102 is modulated and backscattered to the RFID reader 102.

Impedance adder 222 can compensate for the deleterious effects of detuning, including environmental detuning, by providing an amount of impedance to the antenna 210 that helps shift the frequency of the antenna 210 back to the desired resonance frequency. By providing additional or less impedance to the RFID antenna 210, detuning caused by environmental factors, manufacturing tolerances, tag placement tolerances and/or different types of packaging materials or contents can be compensated for. In one exemplary embodiment of the present invention, impedance adder 222 can provide an adjustable source of impedance. The impedance adder 222 couples to the RFID antenna 210 and, when adjusted, can increase or decrease the amount of impedance on antenna 210, shifting the detuned frequency of the RFID tag 104 back to the RFID tag's 104 proper resonance frequency. In one exemplary embodiment, the impedance adder 222 provides variable amounts of impedance via use of variable reactive components such as capacitors and inductors. In one exemplary embodiment, the reactive components can be variable capacitors and variable inductors.

Figure 4:
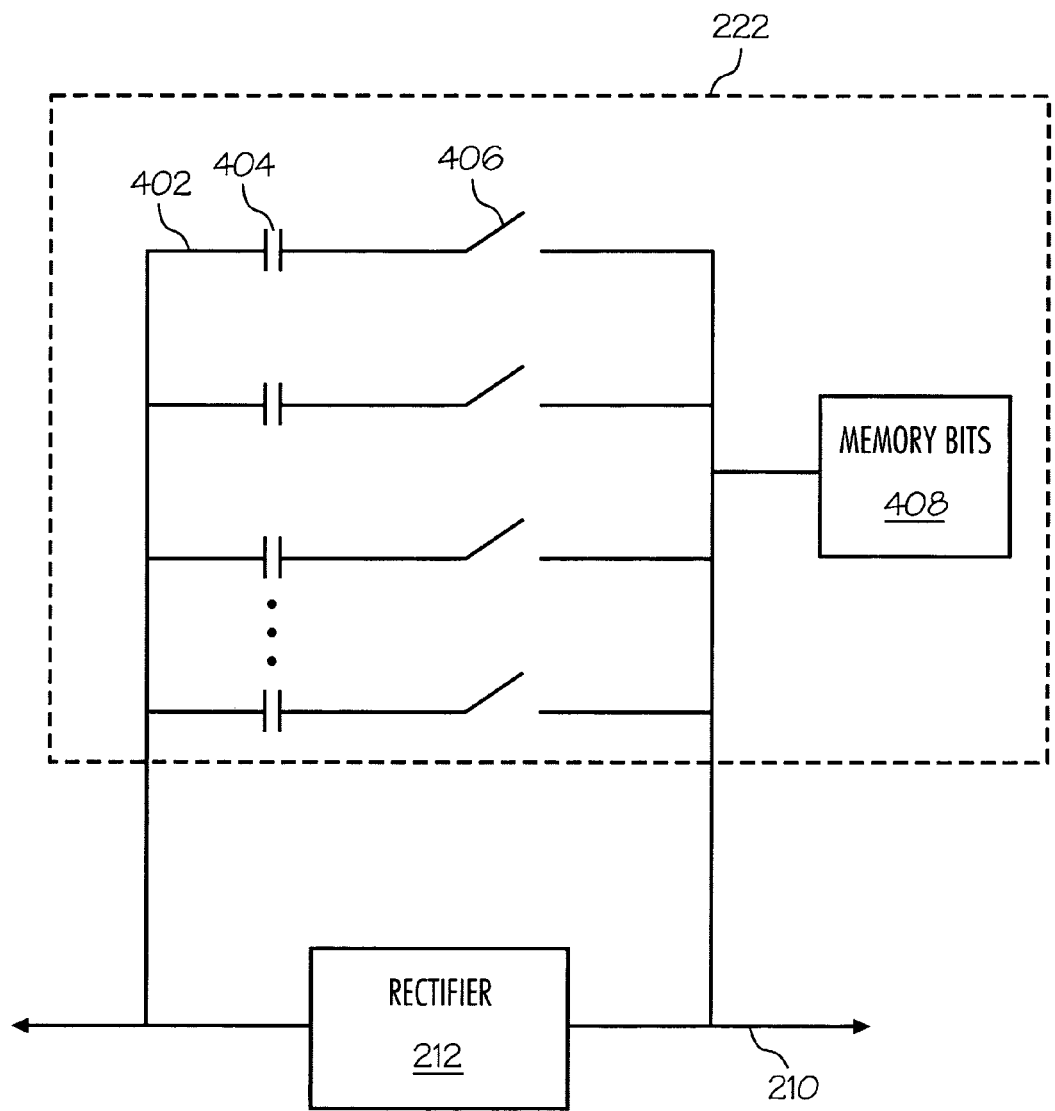
FIG. 4 illustrates an exemplary impedance adder in accordance with an exemplary embodiment of the present invention.

In one exemplary embodiment and with reference to FIG. 4, impedance adder 222 is an impedance tree 402 able to produce variable impedance. In one exemplary embodiment of the impedance tree 402, multiple capacitors 404 can be coupled in parallel to the antenna 210 to provide impedance to compensate for any detuning effects via switches 406. The switches 406, in one exemplary embodiment, are MOSFET switches. However, other appropriate components configured to couple and decouple capacitors 404 to the antenna 210 can be used. In an exemplary impedance tree 402, each capacitor 404 is chosen to provide twice the impedance of the previous capacitor 404 with the first capacitor providing one unit of impedance change and the nth capacitor providing $2^n$ units of impedance change to the antenna 210. For example, if there are a total of three capacitors in the impedance tree 402, the first one can provide one unit of impedance, the second capacitor two units and the third capacitor four units. If the first and third capacitors 404 are coupled to the antenna 210, a total of five units of impedance are provided. Other values of capacitors, which are not related by powers of two, can also be used for impedance tree 402.

The proper amount of impedance to add via the impedance tree 402 can be received at the RFID tag 104, from the RFID reader 102 or other device, as a string of bits, a binary number, a code or some other indication of the setting for the binary impedance tree 402. These bits can be stored at a bit memory 408 and indicate which switches 406 should be in the on or off position. Bit memory 408 can be part of memory 220 or a separate memory structure. In one exemplary embodiment, a default setting of the switches for the impedance tree 402 is stored in the bit memory 408 or other memory such as memory 220. The RFID tag 104 can then be calibrated to provide the proper impedance for the environment and/or packing with which the RFJD tag 104 is associated with and the new setting for the RFID tag 104 can be saved in memory 220.

In one exemplary embodiment, the RFID tag 104 is inductively biased when the impedance adder 222 provides no impedance to the RFID tag 104. To compensate for the inductive bias, the impedance adder 222 can be adjusted to provide enough capacitance to cancel the inductive bias of the RFID tag 104. In one exemplary embodiment, the impedance adder 222 provides half the total capacitance of the impedance adder 222 to cancel the inductive bias. This amount of impedance represents a base impedance amount. Then, by providing less capacitance than the base amount, the frequency will shift to a lower frequency and by adding more capacitance than the base amount, the frequency will shift to a higher frequency. Thus, in such an exemplary embodiment the RFID tag 104 can be adapted in situations where the RFID antenna 210 frequency has shifted either to a higher or lower frequency.

While FIG. 4 illustrates an exemplary impedance adder 222 as a plurality of parallels connected capacitors, a plurality of serially connected capacitors can also be coupled to the antenna 210. Alternatively, both parallels connected capacitors and serially connected capacitors can be used and an optimal combination of the parallels connected capacitors and the serially connected capacitors can be coupled to the antenna 210.

Figure 5:
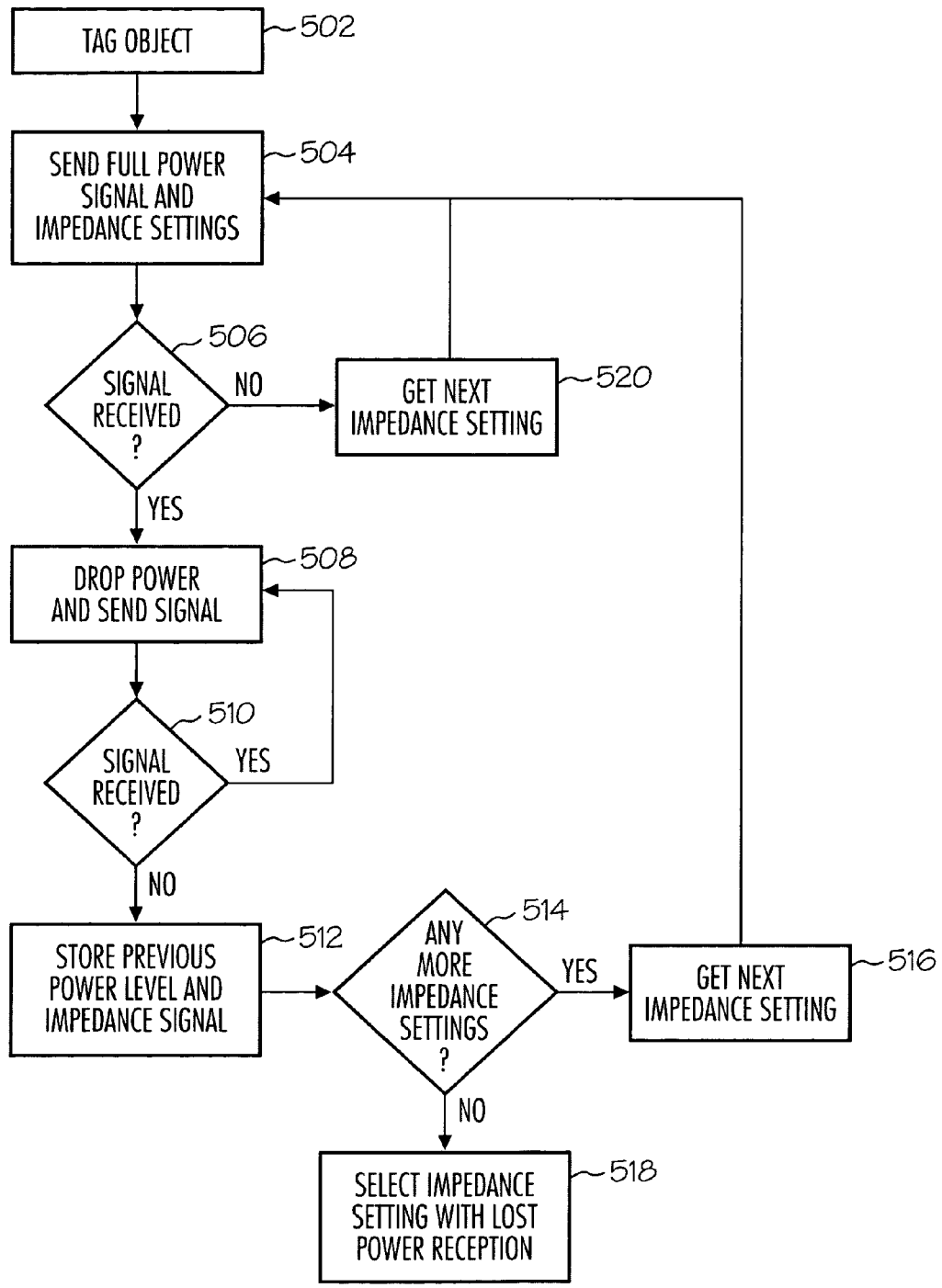
FIG. 5 is a flow chart illustrating a method of tuning a tunable RFID antenna in accordance with an exemplary embodiment of the present invention.

In operation, in one exemplary embodiment of the present invention and with reference to FIG. 5, in step 502, a RFID tag 104 in accordance with the present invention is placed on an item of interest such as bin 107 in FIG. 1. The item of interest or the environment around the item of interest can cause the detuning of the RFID antenna 210. To adjust the tuning of the RFID antenna 210, the RFID reader 102 is set to a maximum power and a signal is sent to the RFID tag 104 in step 504. The signal can include a code, message or other indicator as to what setting the impedance adder 222 should be set. In step 506, it is determined if the RFID tag 104 received the transmission. If the signal is not received in step 506, then the next impedance setting for the impedance adder 222 is selected in step 520 and the process continues at step 504.

If the RFID tag 104 received the transmission, in step 508, the power of the transmitted signal is decreased. Next, in step 510, it is checked to see of the signal is still received by the RFID tag 104. If the signal is still received, steps 508-510 are repeated until the transmitted signal is no longer received by the RFID tag 104. At this point, the RFID reader 102 can record the last power level and code setting for the impedance adder 222, in step 512.

At the completion of step 512, in step 514, it is determined if there are any more settings of the impedance adder 222 that have not been used to attempt to retune the RFID antenna 210. If there are additional settings to try, in step 516, another impedance setting is selected and the process starts over at 504 with the new impedance adder 222 setting. If all possible or practical impedance adder 222 settings have been tried, the impedance setting that allows for reception at the lowest power is chosen as the optimal setting in step 518. The RFID tag 104 is set to this setting. Also, any RFID tag 104 that will be attached to a similar object can be set to the correct impedance adder 222 setting without the need for calibration. Indeed, a RFID tag 104, in accordance with the teachings of the present invention, can be calibrated for a number of different products and the settings needed can be stored in a database or listing. Instead of using specifically designed RFID tags for each product, the RFID tag 104 in accordance with the teachings of the present invention, can be adjusted based on the products to which it is attached. This reduces complexities and costs in a RFID system.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A RFID tag comprising:
   a base impedance;
   an antenna configured to receive radio frequency signals at about a resonant frequency when coupled to the base impendence and configured to receive a signal specifying an amount of impedance needed for the antenna; and
   an adjustable impedance tree coupled to the antenna, the adjustable impedance tree configured to adjust the base impedance in response to receiving the signal specifying the amount of impedance needed for the antenna.

2. The RFID tag of claim 1 further comprising a non-volatile writable memory configured to store the amount of impedance needed for the antenna.

3. The RFID tag of claim 1 wherein the RFID tag is inductively biased when no impedance is provided by the impedance tree.

4. The RFID tag of claim 1 wherein the impedance tree comprises a plurality of capacitors, each capacitor switchably coupled to the antenna.

5. The RFID tag of claim 4 wherein the plurality of capacitors are in parallel with each other.

6. The RFID tag of claim 4 wherein the plurality of capacitors are in series with each other.

7. The RFID tag of claim 1 wherein the RFID tag is an active tag.

8. The RFID tag of claim 1 further comprising a state machine coupled to the antenna and the impedance tree, the state machine comprising different states corresponding to different amounts of impedance to be provided by the impedance tree.

9. The RFID tag of claim 8 wherein the RFID tag is configured to receive a signal indicative of a state to which to set the state machine.

10. The RFID tag of claim 2 wherein the memory stores the default setting for the impedance tree.

11. A method for adjusting the tuning of a RFID antenna:
    receiving a signal at the RFID antenna, the signal including a setting indicative of an amount of impedance to provide to adjust the tuning of the RFID antenna;
    adjusting an impedance source based on the amount of impedance indicated by the setting; and
    coupling the amount of impedance from the impedance source to the RFID antenna.

12. The method of claim 11 wherein the step of coupling the amount of impedance further comprises coupling one or more capacitors to the RFID antenna to provide the amount of impedance.

13. The method of claim 12 further comprising setting the impedance source to a default setting.

14. The method of claim 13 further comprising storing the default setting to a non-volatile memory.

15. The method of claim 13 further comprising replacing the default setting with the setting provided in the signal.

16. A RFID tag comprising:
    a RFID antenna designed to receive RF signals at about a resonant frequency and to receive a signal specifying an amount of impedance needed for the RFID antenna; and
    an impedance tree configured to adjust the impedance of the RFID antenna in response to receiving the signal specifying the amount of impedance needed for the RFID antenna, the impedance tree coupled to RFID antenna.

17. The RFID tag of claim 16 wherein the impedance tree is configured to provide more or less impedance to the RFID antenna in response to a receiving the signal specifying the amount of impedance needed for the RFID antenna.

18. The RFID tag of claim 17 further comprising a state machine coupled to the impedance tree, the state machine including one or more states corresponding to different amounts of impedances to be provided by the impedance tree.

19. The RFID tag of claim 16 wherein the impedance tree comprises a plurality of capacitors switchably coupled to the antenna.

20. The RFID tag of claim 16 wherein the RFID tag can be applied to a plurality of products, the impedance tree set to provide a different amount of impedance for each of the plurality of products to which the RFID tag can be applied.

21. The RFID tag of claim 16 wherein the impedance tree comprises a plurality of inductors switchably coupled to the antenna.

* * * * *